(12) United States Patent
Hsu et al.

(10) Patent No.: US 11,495,709 B2
(45) Date of Patent: *Nov. 8, 2022

(54) PATTERNED EPITAXIAL SUBSTRATE AND SEMICONDUCTOR STRUCTURE

(71) Applicant: PlayNitride Display Co., Ltd., MiaoLi County (TW)

(72) Inventors: Kuang-Yuan Hsu, MiaoLi County (TW); Chien-Chih Yen, MiaoLi County (TW); Yen-Lin Lai, MiaoLi County (TW); Shen-Jie Wang, MiaoLi County (TW); Sheng-Yuan Sun, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 12 days.

This patent is subject to a terminal disclaimer.

(21) Appl. No.: 17/243,577

(22) Filed: Apr. 29, 2021

(65) Prior Publication Data

US 2021/0265527 A1    Aug. 26, 2021

Related U.S. Application Data

(63) Continuation-in-part of application No. 16/669,526, filed on Oct. 31, 2019, now Pat. No. 11,063,181.

(30) Foreign Application Priority Data

May 23, 2019 (TW) ................................. 108117777

(51) Int. Cl.
*H01L 33/20* (2010.01)
*H01L 33/50* (2010.01)
*H01L 33/22* (2010.01)

(52) U.S. Cl.
CPC .............. *H01L 33/20* (2013.01); *H01L 33/22* (2013.01); *H01L 33/502* (2013.01)

(58) Field of Classification Search
CPC ........... H01L 21/0203; H01L 21/02035; H01L 27/14601; H01L 27/14632;
(Continued)

(56) References Cited

U.S. PATENT DOCUMENTS

| 11,063,181 B2 * | 7/2021 | Hsu ......................... H01L 33/58 |
| 2010/0258911 A1 | 10/2010 | Nakayama |
| 2019/0334059 A1 * | 10/2019 | Chen ...................... H01L 33/025 |

FOREIGN PATENT DOCUMENTS

| CN | 103050596 | 4/2013 |
| CN | 205104512 | 3/2016 |

(Continued)

OTHER PUBLICATIONS

Office Action of China Counterpart Application, dated May 14, 2021, pp. 1-10.

*Primary Examiner* — Cheung Lee
(74) *Attorney, Agent, or Firm* — JCIPRNET

(57) ABSTRACT

A patterned epitaxial substrate includes a substrate and a plurality of patterns. The substrate has a first zone and a second zone surrounding the first zone. The first zone is disposed around a center of the substrate. The patterns and the substrate are integrally formed, and the patterns are disposed on the substrate. The patterns include a plurality of first patterns and a plurality of second patterns. The first patterns are disposed in the first zone. The second patterns are disposed in the second zone. Sizes of the first patterns are different from sizes of the second patterns.

13 Claims, 14 Drawing Sheets

(58) Field of Classification Search
CPC . H01L 27/14687; H01L 27/307; H01L 27/32; H01L 33/02; H01L 33/025; H01L 33/20; H01L 33/22; H01L 33/24; H01L 33/502; H01L 33/505; H01L 33/58; H01L 51/0096; H01L 51/50; H01L 51/52; C30B 25/18; C30B 25/20
See application file for complete search history.

(56) References Cited

FOREIGN PATENT DOCUMENTS

| | | |
|---|---|---|
| CN | 105514244 | 4/2016 |
| CN | 106159052 | 11/2016 |

\* cited by examiner

PATTERNED EPITAXIAL SUBSTRATE AND SEMICONDUCTOR STRUCTURE

CROSS-REFERENCE TO RELATED APPLICATION

This application is a continuation-in-part application of and claims the priority benefit of U.S. application Ser. No. 16/669,526, filed on Oct. 31, 2019, now allowed, which claims the priority benefit of Taiwan application serial no. 108117777, filed on May 23, 2019. The entirety of each of the above-mentioned patent applications is hereby incorporated by reference herein and made a part of this specification.

BACKGROUND

Technical Field

The disclosure relates to a substrate structure and a semiconductor structure; more particularly, the disclosure relates to a patterned epitaxial substrate and a semiconductor structure to which the patterned epitaxial substrate is applied.

Description of Related Art

With the advancement of photoelectric technologies, the volume of many photoelectric devices has gradually become smaller and smaller. In the process of manufacturing a micro light-emitting diode (LED), it is necessary to grow another different material (such as an epitaxial structure) on one material (such as an epitaxial substrate); in this case, the thermal expansion coefficient and the atomic lattice matching level of the two materials must be taken into consideration. The thermal temperature difference or the difference in the thermal expansion coefficient in a heating process and a lattice mismatch lead to uneven distribution of stresses, stress unevenness, thus causing warpage of the edge of the epitaxial substrate and resulting in a decrease in yield of subsequent manufacturing processes.

SUMMARY

The disclosure provides a patterned epitaxial substrate capable of preventing the warpage of the edge in the heating process and improving the yield of the subsequent manufacturing processes.

The disclosure further provides a semiconductor structure including the aforesaid patterned epitaxial substrate and featuring good photoelectric properties and reliability.

The disclosure further provides a semiconductor structure configured to adjust full band wavelength uniformity.

According to an embodiment of the disclosure, a patterned epitaxial substrate including a substrate and a plurality of patterns is provided. The substrate has a first zone and a second zone surrounding the first zone. The first zone is disposed around a center of the substrate. The patterns and the substrate are integrally formed, and the patterns are disposed on the substrate. The patterns include a plurality of first patterns and a plurality of second patterns. The first patterns are disposed in the first zone. The second patterns are disposed in the second zone. Sizes of the first patterns are different from sizes of the second patterns.

In an embodiment of the disclosure, each of the first patterns has a first orthogonal projection area on the substrate, each of the second patterns has a second orthogonal projection area on the substrate, and the first orthogonal projection area is greater than the second orthogonal projection area. Each of the first patterns has a first vertical height on the substrate, and each of the second patterns has a second vertical height on the substrate. Each of the first patterns has a first bottom width on the substrate, and each of the second patterns has a second bottom width on the substrate. The first vertical height is greater than the second vertical height, and the first bottom width is greater than the second bottom width.

In an embodiment of the disclosure, there is a first pitch between any two adjacent first patterns of the first patterns, there is a second pitch between any two adjacent second patterns of the second patterns, and the first pitch is less than the second pitch.

In an embodiment of the disclosure, a ratio of the first zone to the substrate is from 0.4 to 0.8. A ratio of the second zone to the substrate is 0.1 to 0.5.

In an embodiment of the disclosure, the substrate further has a third zone surrounding the second zone. The patterns further include third patterns. The third patterns are disposed in the third zone, and sizes of the third patterns are different from the sizes of the second patterns and the sizes of the first patterns. A ratio of the first zone to the substrate is from 0.4 to 0.8, and a ratio of the second zone to the substrate is from 0.1 to 0.5.

According to an embodiment of the disclosure, a semiconductor structure including a patterned epitaxial substrate, a first-type semiconductor layer, a light-emitting layer, and a second-type semiconductor layer is provided. The patterned epitaxial substrate includes a substrate and a plurality of patterns. The substrate has a first zone and a second zone surrounding the first zone, wherein the first zone is disposed around a center of the substrate. The patterns and the substrate are integrally formed, and the patterns are disposed on the substrate. The patterns include a plurality of first patterns and a plurality of second patterns. The first patterns are disposed in the first zone. The second patterns are disposed in the second zone. Sizes of the first patterns are different from sizes of the second patterns. The first-type semiconductor layer is disposed on the patterned epitaxial substrate. The light-emitting layer is disposed on the first-type semiconductor layer. The second-type semiconductor layer is disposed on the light-emitting layer.

According to an embodiment of the disclosure, a semiconductor structure including a first-type semiconductor layer, a plurality of patterns, a light-emitting layer, and a second-type semiconductor layer is provided. The first-type semiconductor layer has a top surface and a bottom surface opposite to each other. The bottom surface has a first zone and a second zone surrounding the first zone. The first zone is disposed around a center of the bottom surface. The patterns are disposed on the bottom surface of the first-type semiconductor layer, and the patterns and the first-type semiconductor layer are integrally formed. The patterns include a plurality of first patterns and a plurality of second patterns. The first patterns are disposed in the first zone. The second patterns are disposed in the second zone. Sizes of the first patterns are different from sizes of the second patterns. The light-emitting layer is disposed on the top surface of the first-type semiconductor layer. The second-type semiconductor layer is disposed on the light-emitting layer.

In an embodiment of the disclosure, the semiconductor structure further includes a wavelength converting layer with a particle size of less than 100 nanometers, disposed in the plurality of patterns.

In an embodiment of the disclosure, a volume ratio of the plurality of patterns to the wavelength converting layer is greater than or equal to 0.5 and less than or equal to 1.0.

In an embodiment of the disclosure, the plurality of patterns partially or completely pass through an area of the light-emitting layer.

In an embodiment of the disclosure, a minimum distance between the patterns passing through the area of the light-emitting layer is greater than or equal to 1 nanometer.

In an embodiment of the disclosure, a ratio of an etching depth of the plurality of patterns to a height of the semiconductor structure is less than or equal to 0.8.

In an embodiment of the disclosure, the first patterns of the first zone are random surround with different pitches.

In view of the above, according to the design of the patterned epitaxial substrate provided in one or more embodiments of the disclosure, the patterns and the substrate are integrally formed, the first zone and the second zone of the substrate are disposed in a concentric manner, and the sizes of the first patterns disposed in the first zone are different from the sizes of the second patterns in the second zone. Thereby, the issue of the warpage of the edge of the conventional substrate in the heating process can be effectively prevented, and the yield of the subsequent manufacturing processes can be improved. Besides, the semiconductor structure to which the aforesaid patterned epitaxial substrate is applied can have good photoelectric properties and reliability.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1A:
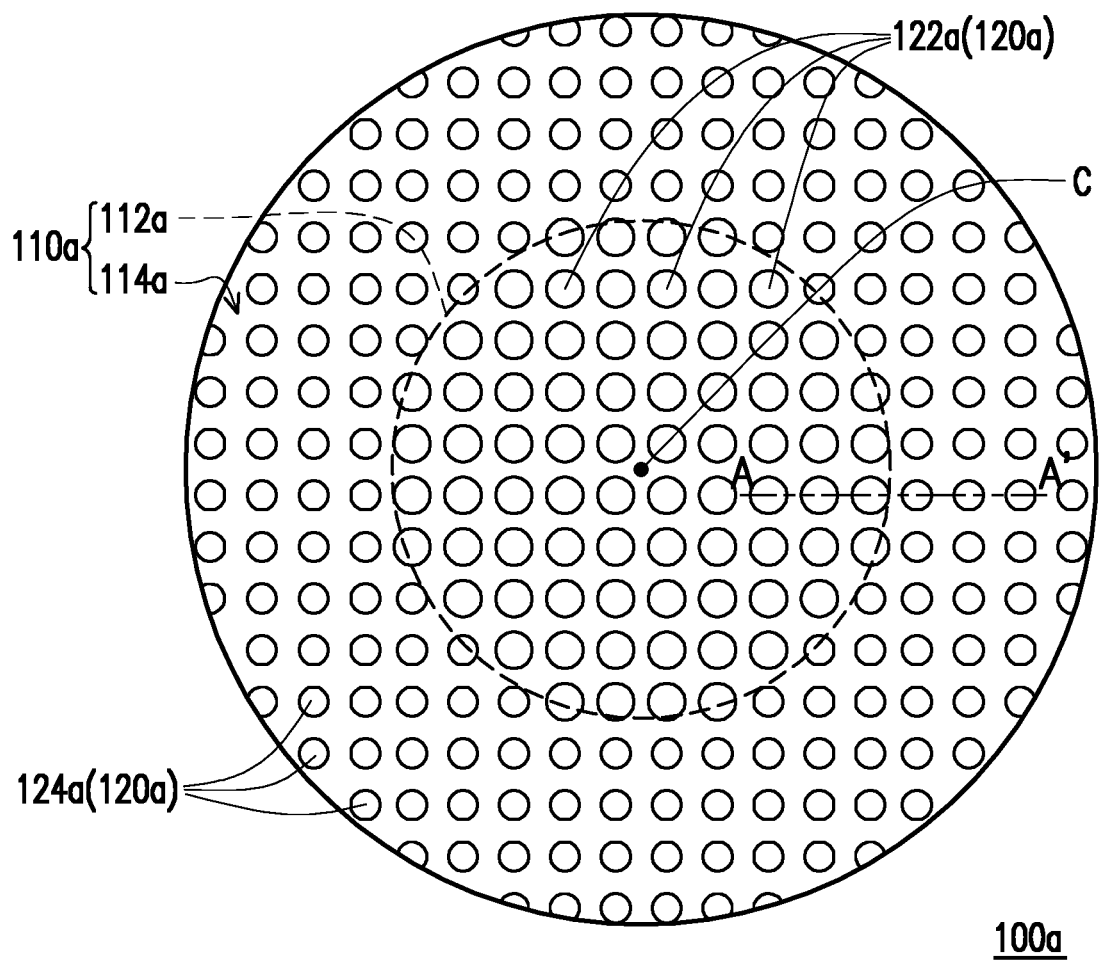
FIG. 1A is a schematic top view of a patterned epitaxial substrate according to an embodiment of the disclosure.
Figure 1B:
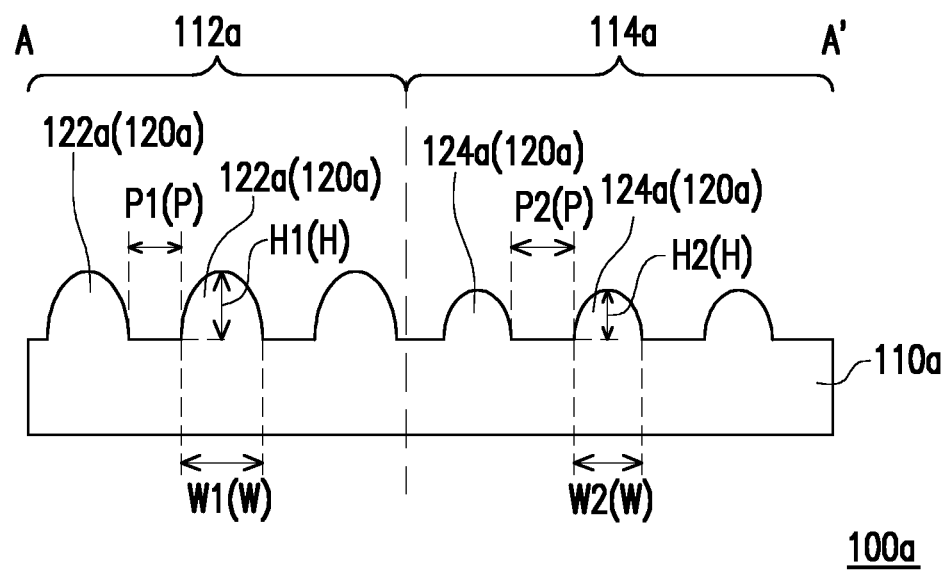
FIG. 1B is a schematic cross-sectional view of the patterned epitaxial substrate depicted in FIG. 1A along a line segment A-A'.

FIG. 1A is a schematic top view of a patterned epitaxial substrate according to an embodiment of the disclosure. FIG. 1B is a schematic cross-sectional view of the patterned epitaxial substrate depicted in FIG. 1A along a line segment A-A'. With reference to FIG. 1A, a patterned epitaxial substrate 100a provided in the embodiment includes a substrate 110a and a plurality of patterns 120a. The substrate 110a has a center point C and has a first zone 112a and a second zone 114a surrounding the first zone 112a. Specifically, the first zone 112a and the second zone 114a of the substrate 110a are disposed in a concentric manner. In particular, the first zone 112a and the second zone 114a of the substrate 110a, which should however not be construed as a limitation in the disclosure. Note that a ratio of the first zone 112a to the substrate 110a is from 0.4 to 0.8. If the ratio of the first zone 112a to the substrate 110a is less than 0.4 or greater than the 0.8, the problem of warpage of the edge cannot be well solved. Herein, the substrate 110a is suitable for epitaxial growth, such as a sapphire substrate, a silicon wafer substrate, a carbide substrate, or a polymer substrate, which should however not be construed as a limitation in the disclosure.

According to the present embodiment, note that the substrate 110a is divided into two zones (i.e., the first zone 112a and the second zone 114a) sharing the same center, and the first zone 112a and the second zone 114a respectively have the circular profile, which should however not be construed as limitations in the disclosure. In other embodiments that are not shown in the drawings, the substrate can also be divided into three or more zones sharing the same center, and the shape of each region can be a rectangular shape, a polygonal shape, or any other appropriate shape.

Besides, in this embodiment, the patterns 120a provided and substrate 110a are integrally formed, i.e., the patterns 120a and the substrate 110a are made of the same material and connected in a seamless manner. As shown in FIG. 1A, the patterns 120a provided in the embodiment are arranged in an array on the substrate 110a, and the patterns 120a include a plurality of first patterns 122a and a plurality of second patterns 124a. The first patterns 122a are disposed in the first zone 112a, and the second patterns 124a are disposed in the second zone 114a. In an embodiment that is not shown in the drawings, the first patterns and the second patterns can also be arranged not in an array. Specifically, sizes of the first patterns 122a are different from sizes of the second patterns 124a.

In detail, each of the first patterns 122a has a first orthogonal projection area on the substrate 110a, and each of the second patterns 124a has a second orthogonal projection area on the substrate 110a. In the present embodiment, the first orthogonal projection area is greater than the second orthogonal projection area. That is, the sizes of the first patterns 122a located in the first zone 112a of the substrate 110a are greater than the sizes of the second patterns 124a located in the second zone 114a.

With reference to FIG. 1B, as shown in the cross-sectional view, the cross-sectional shape of each of the patterns 120a is a convex pattern, which should however not be construed as a limitation in the disclosure. In detail, each of the first patterns 122a has a first vertical height H1 and a first bottom width W1, and there is a first pitch P1 between the adjacent first patterns 122a. Each of the second patterns 124a has a second vertical height H2 and a second bottom width W2, and there is a second pitch P2 between the adjacent second patterns 124a. In the present embodiment, the first vertical height H1 is greater than the second vertical height H2, the first bottom width W1 is greater than the second bottom width W2, and the first pitch P1 is less than the second pitch P2. That is, the sizes of the first patterns 122a located in the first zone 112a of the substrate 110a are greater than the sizes of the second patterns 124a located in the second zone 114a. Since the sizes of the second patterns 124a are relatively small, stresses can be dispersed in the epitaxial growth process, so as to better solve the problem of warpage of the edge of the epitaxial substrate. Certainly, in other embodiments that are not shown in the drawings, the sizes of the first patterns located in the first zone of the substrate can also be smaller than the sizes of the second patterns located in the second zone according to actual demands, which still falls within the scope of protection in the disclosure. Note that the sizes include the orthogonal projection area, the vertical height, the bottom width, or the pitch between the adjacent patterns. As long as any of the orthogonal projection area, the vertical height, the bottom width, and the pitch is different, the sizes are deemed different.

Specifically, in an embodiment, a ratio of the height H and the bottom width W of the patterns 120a is, for instance, from 0.2 to 0.9. If the ratio of the height H and the bottom width W of the patterns 120a is greater than 0.9, defects are generated in an epitaxial structure (not shown) subsequently formed on the patterned epitaxial substrate 100a. By contrast, if the ratio of the height H and the bottom width W of the patterns 120a is less than 0.2, the light-emitting efficiency of the epitaxial structure subsequently formed on the patterned epitaxial substrate 100a cannot be improved. In an embodiment, if the height H of the patterns 120a is, for instance, greater than or equal to 10 nm and less than or equal to 1500 nm, the epitaxial structure subsequently formed on the patterned epitaxial substrate 100a can have favorable light-emitting efficiency. In another embodiment, the bottom width W of the patterns 120a is, for instance, greater than or equal to 0.1 μm and less than or equal to 2.5 μm, so that the epitaxial structure subsequently formed on the patterned epitaxial substrate 100a can have favorable light-emitting efficiency. Besides, there is a pitch P between any two adjacent patterns 120a, and the pitch P in an embodiment is less than or equal to 0.5 μm, which allows the epitaxial structure subsequently formed on the patterned epitaxial substrate 100a to have favorable light-emitting efficiency.

In brief, according to the design of the patterned epitaxial substrate 100a provided in the embodiment, the patterns 120a and the substrate 110a are integrally formed, and the first zone 112a and the second zone 114a of the substrate 110a are disposed in a concentric manner. Specifically, the sizes of the first patterns 122a disposed in the first zone 112a of the substrate 110a are different from the sizes of the second patterns 124a located in the second zone 114a. Thereby, the issue of the warpage of the edge of the conventional substrate in the heating process can be effectively prevented. That is, the yield of the subsequent manufacturing process can be improved through the design of the patterns 120a of the patterned epitaxial substrate 100a provided in the embodiment.

Figure 2A:
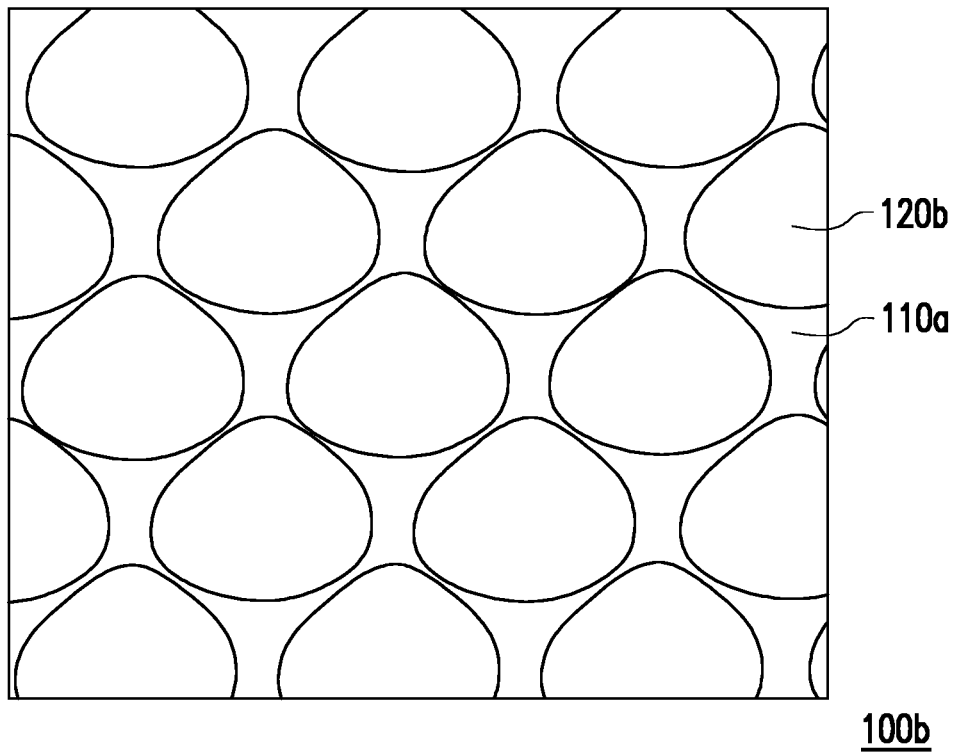
FIG. 2A is a schematic three-dimensional view of a portion of a patterned epitaxial substrate according to another embodiment of the disclosure.
Figure 2B:
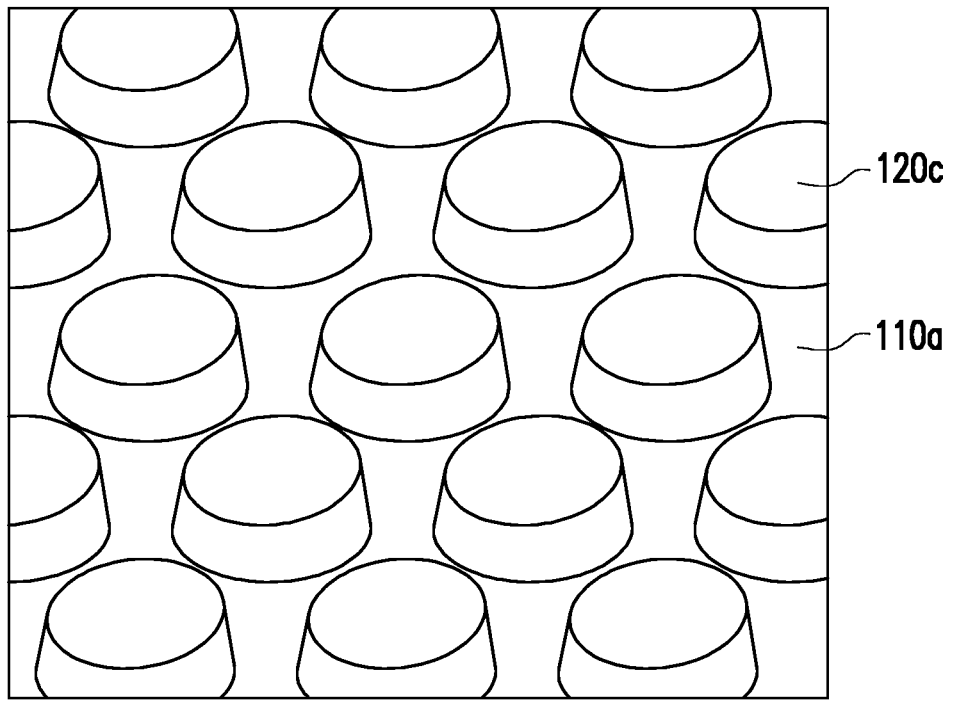
FIG. 2B is a schematic three-dimensional view of a portion of a patterned epitaxial substrate according to still another embodiment of the disclosure.
Figure 2C:
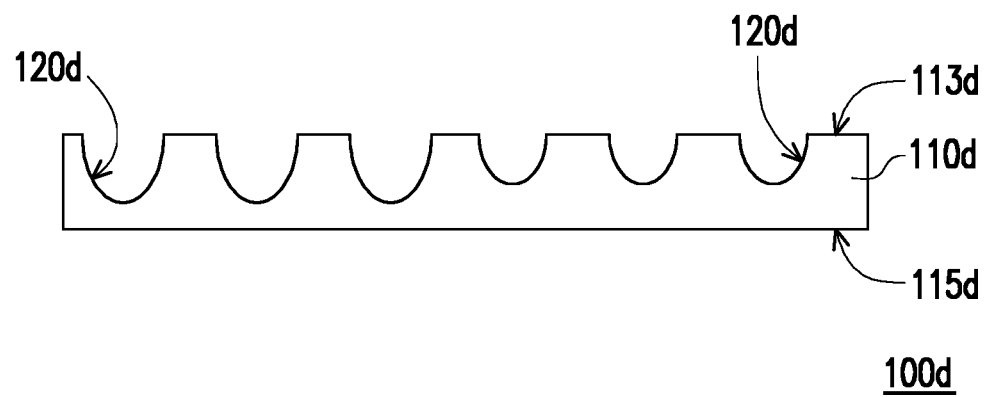
FIG. 2C is a schematic cross-sectional view of a patterned epitaxial substrate according to still another embodiment of the disclosure.

It should be mentioned that the structural type of the patterns 120a is not construed as a limitation in the disclosure. In an embodiment, with reference to FIG. 2A, the patterns 120b of the patterned epitaxial substrate 100b are shaped as a cone on the substrate 110a, and the corn shape allows the epitaxial structure subsequently formed on the patterned epitaxial substrate 100a to have favorable light-emitting efficiency and light-emitting shapes. Alternatively, with reference to FIG. 2B, the patterns 120c of the patterned epitaxial substrate 100c are shaped as a cylinder on the substrate 110a. Alternatively, with reference to FIG. 2C, the cross-sectional shape of the patterns 120d of the patterned epitaxial substrate 100d is a concave pattern; namely, the patterns 120d sink in a direction from an upper surface 113d to a lower surface 115d of the substrate 110d. Certainly, in other embodiments that are not shown in the drawings, the shape of the patterns can be selected from a polygonal cylinder, a polygonal cone, any other appropriate shape, or a combination thereof, which should however not be construed as a limitation in the disclosure.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 3A:
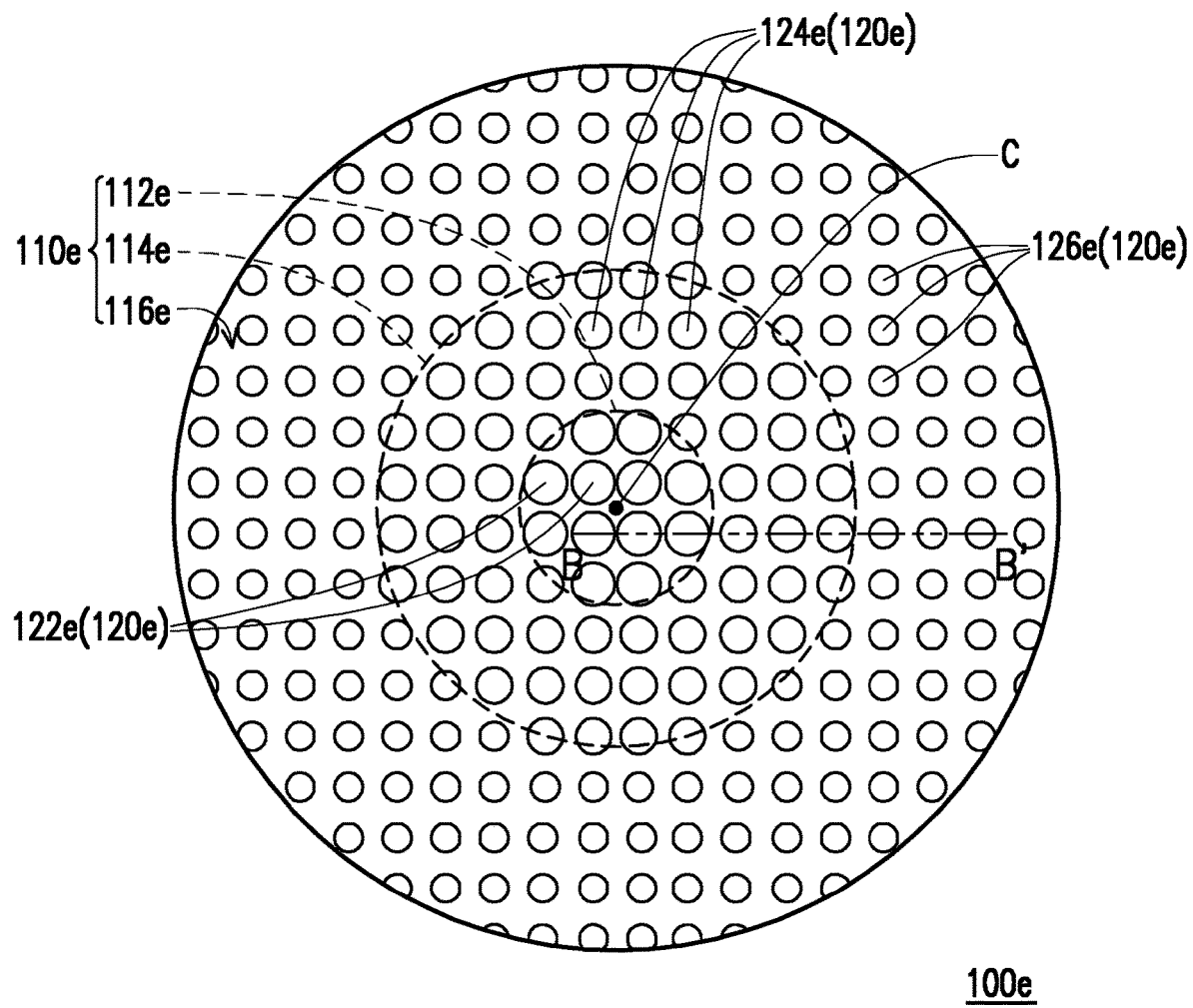
FIG. 3A is a schematic top view of a patterned epitaxial substrate according to another embodiment of the disclosure.
Figure 3B:
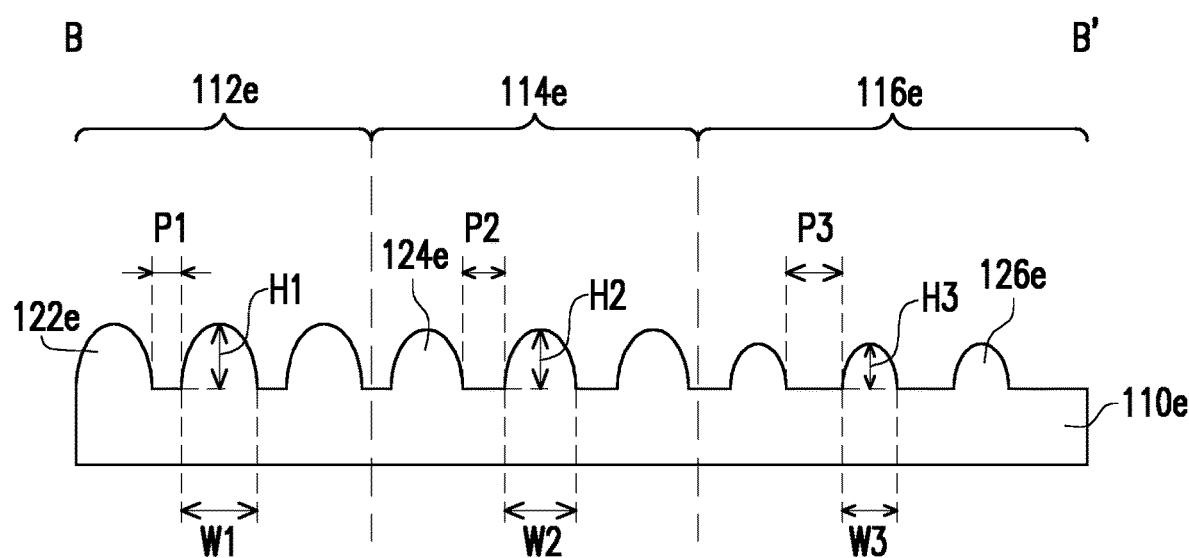
FIG. 3B is a schematic cross-sectional view of the patterned epitaxial substrate depicted in FIG. 3A along a line segment B-B'.

FIG. 3A is a schematic top view of a patterned epitaxial substrate according to another embodiment of the disclosure. FIG. 3B is a schematic cross-sectional view of the patterned epitaxial substrate depicted in FIG. 3A along a line segment B-B'. With reference to FIG. 1A and FIG. 3A, the patterned epitaxial substrate 100e provided in the embodiment is similar to the aforesaid patterned epitaxial substrate 100a, while the difference therebetween lies in that the patterned epitaxial substrate 100e further has a third zone 116e surrounding the second zone 114e, and the third zone 116e, the first zone 112e, and the second zone 114e are disposed in a concentric manner. Herein, the ratio of the first zone 112e to the substrate 110e is from 0.4 to 0.8, and the ratio of the second zone 114e to the substrate 110e is from 0.1 to 0.5, so as to better solve the problem of warpage of the edge. The patterns 120e further include a plurality of third patterns 126e, wherein the third patterns 126e are disposed in the third zone 116e of the substrate 110e. Specifically, sizes of the third patterns 126e are different from the sizes of the second patterns 124e and the sizes of the first patterns 122e.

In detail, each of the first patterns 122e has a first orthogonal projection area on the substrate 110e. Each of the second patterns 124e has a second orthogonal projection area on the substrate 110e. Each of the third patterns 126e has a third orthogonal projection area on the substrate 110e. The first orthogonal projection area, the second orthogonal projection area, and the third orthogonal projection area appear to be decreased in a progressive manner in a radial direction from each of the first patterns 122e to each of the third patterns 126e. That is, the orthogonal projection areas of the first patterns 122e, the second patterns 124e, and the third patterns 126e sequentially on the first zone 112e, the second zone 114e, and the third zone 116e of the substrate 110e appear to have a progressive change and are gradually decreased.

To be more specific, the orthogonal projection area of the first patterns 122e on the substrate 110e is greater than the orthogonal projection area of the second patterns 124e on the substrate 110e, and the orthogonal projection area of the second patterns 124e on the substrate 110e is greater than the orthogonal projection area of the third patterns 126e on the substrate 110e. In other embodiments that are not shown in the drawings, the first orthogonal projection area, the second orthogonal projection area, and the third orthogonal projection area can also appear to be increased in a progressive manner, which should however not be construed as a limitation in the disclosure. In an embodiment, a rate of the progressive change is from 1% to 5%, for instance; that is, the proportion of the difference between the first orthogonal projection area and the third orthogonal projection area to the first orthogonal projection area is from 1% to 5%.

More particularly, with reference to FIG. 3B, in the cross-sectional view, each of the first patterns 122e has a first vertical height H1 and a first bottom width W1, and there is a first pitch P1 between the adjacent first patterns 122e. Each of the second patterns 124e has a second vertical height H2 and a second bottom width W2, and there is a second pitch P2 between the adjacent second patterns 124e. Each of the third patterns 126e has a third vertical height H3 and a third bottom width W3, and there is a third pitch P3 between the adjacent third patterns 126e. Specifically, in the radial direction from the first patterns 122e to the third patterns 126e, i.e., the first vertical height H1, the second vertical height H2, and the third vertical height H3 sequentially on the first zone 112e, the second zone 114e, and the third zone 116e of the substrate 110e appear to be decreased in a progressive manner, the first bottom width W1, the second bottom width W2, and the third bottom width W3 appear to be decreased in a progressive manner, and the first pitch P1, the second pitch P2, and the third pitch P3 appear to be increased in a progressive manner.

In detail, the first vertical height H1 is greater than the second vertical height H2, the second vertical height H2 is greater than the third vertical height H3, the first pitch P1 is less than the second pitch P2, and the second pitch P2 is less than the third pitch P3. In other embodiments that are not shown in the drawings, the first vertical height, the second vertical height, and the third vertical height can appear to be increased in a progressive manner, and the first pitch, the second pitch, and the third pitch can appear to be decreased in a progressive manner, which should however not be construed as limitations in the disclosure. In an embodiment, a rate of the progressive change is from 1% to 5%; that is, the proportion of the difference between the first vertical height H1 and the third vertical height H3 to the first vertical height H1 is from 1% to 5%, and the proportion of the difference between the first pitch P1 and the third pitch P3 to the first pitch P1 is from 1% to 5%.

In brief, according to the design of the patterned epitaxial substrate 100e provided in the embodiment, the patterns 120e and the substrate 110e are integrally formed, and the first zone 112e, the second zone 114e, and the third zone 116e of the substrate 110e are disposed in a concentric manner. Specifically, the patterns 120e appear to have a progressive change in a radial direction from the center to the edge of the substrate 110e. Thereby, the issue of the warpage of the edge of the conventional substrate in the heating process can be effectively prevented. That is, the yield of the subsequent manufacturing process can be improved through the design of the patterns 120e of the patterned epitaxial substrate 100e provided in the embodiment.

Figure 4:
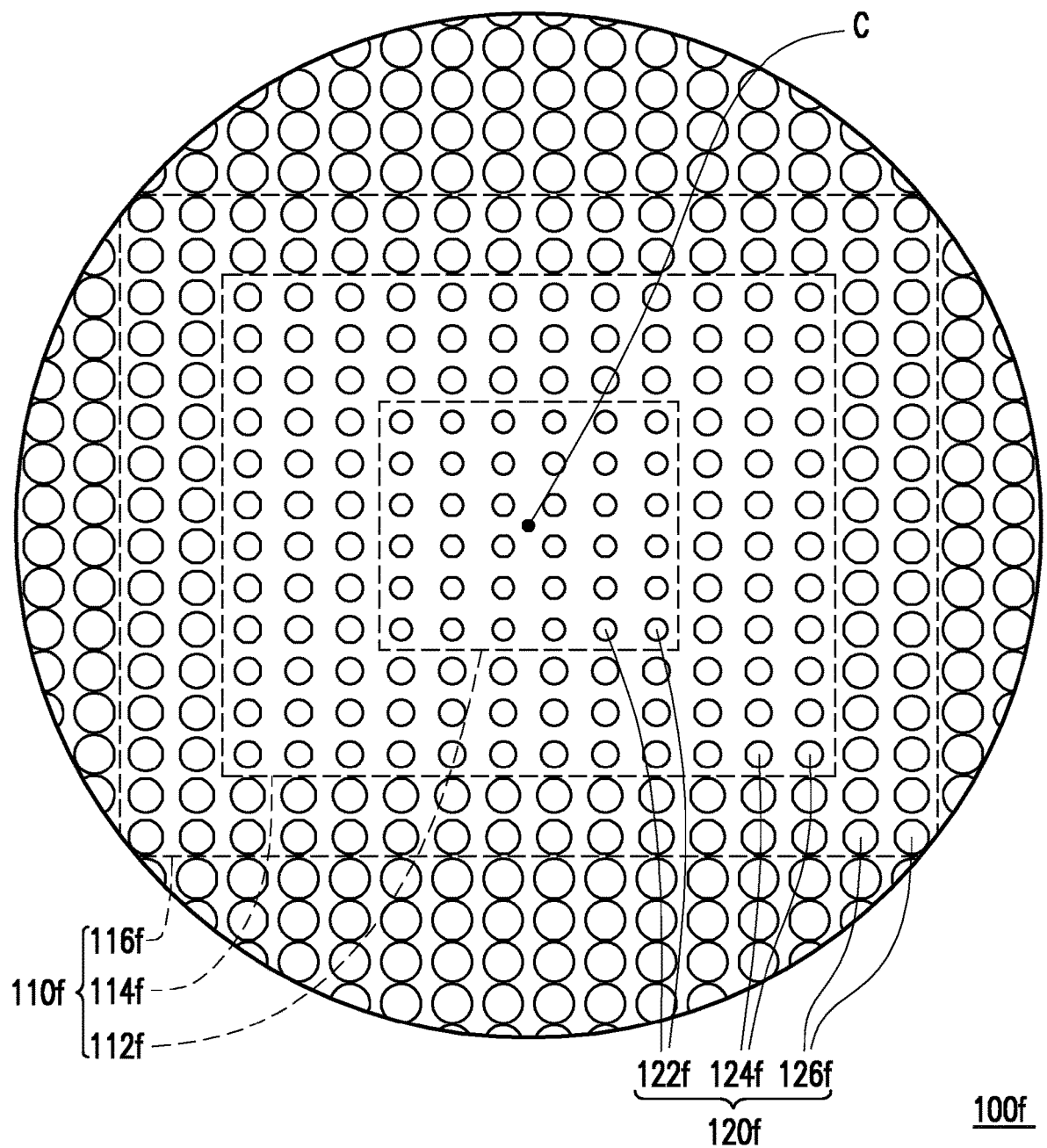
FIG. 4 is a schematic top view of a patterned epitaxial substrate according to still another embodiment of the disclosure.

FIG. 4 is a schematic top view of a patterned epitaxial substrate according to still another embodiment of the disclosure. With reference to FIG. 3A and FIG. 4, the patterned epitaxial substrate 100f provided in the embodiment is similar to the aforesaid patterned epitaxial substrate 100e, while the difference therebetween lies in that the first zone 112f, the second zone 114f, and the third zone 116f of the substrate 110f of the patterned epitaxial substrate 100f provided in the embodiment share the same center C (are arranged in a concentric manner), wherein the first zone 112f, the second zone 114f, and the third zone 116f are respectively shaped as a rectangle. The first orthogonal projection area, the second orthogonal projection area, and the third orthogonal projection area appear to be increased in a progressive manner in a radial direction from each of the first patterns 122f to each of the third patterns 126f. That is, the orthogonal projection areas of the first patterns 122f, the second patterns 124f, and the third patterns 126f sequentially on the first zone 112f, the second zone 114f, and the third zone 116f of the substrate 110f appear to have a progressive change and are gradually increased.

To be more specific, the orthogonal projection area of the first patterns 122f on the substrate 110f is less than the orthogonal projection area of the second patterns 124f on the substrate 110f, and the orthogonal projection area of the second patterns 124f on the substrate 110f is less than the orthogonal projection area of the third patterns 126f on the substrate 110f. In other embodiments that are not shown in the drawings, the first orthogonal projection area, the second orthogonal projection area, and the third orthogonal projection area can also appear to be decreased in a progressive manner, which should however not be construed as a limitation in the disclosure.

In other embodiments that are not shown in the drawings, in the radial direction from the first patterns to the third patterns, note that the first vertical height, the second vertical height, and the third vertical height of the first patterns, the second patterns, and the third patterns can also appear to be decreased in a progressive manner; alternatively, the first pitch, the second pitch, and the third pitch of the first patterns, the second patterns, and the third patterns appear to be increased in a progressive manner, which still falls within the scope of protection provided herein.

Figure 5A:
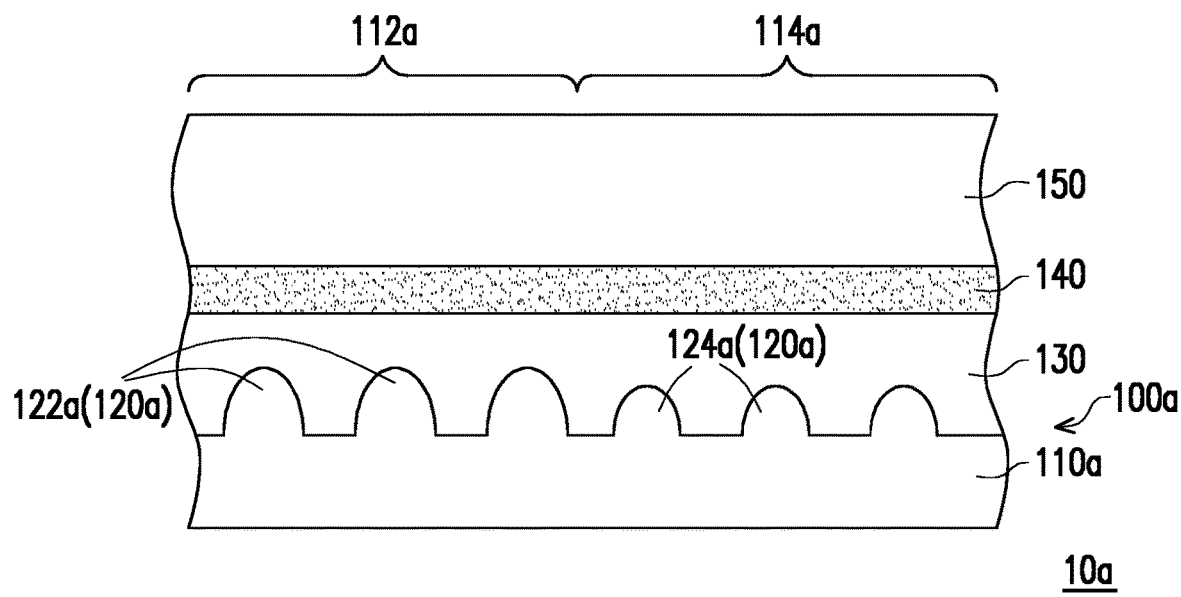
FIG. 5A is a schematic cross-sectional view of a semiconductor structure according to an embodiment of the disclosure.

FIG. 5A is a schematic cross-sectional view of a semiconductor structure according to an embodiment of the disclosure. With reference to FIG. 5A, the semiconductor structure 10a provided in the present embodiment includes the patterned epitaxial substrate 100a depicted in FIG. 1B, a first-type semiconductor layer 130, a light-emitting layer 140, and a second-type semiconductor layer 150. Specifically, the first-type semiconductor layer 130 is disposed on the patterned epitaxial substrate 100a, the light-emitting layer 140 is disposed on the first-type semiconductor layer 130, and the second-type semiconductor layer 150 is disposed on the light-emitting layer 140. That is, the first-type semiconductor layer 130 and the second-type semiconductor layer 150 are respectively disposed on two sides of the light-emitting layer 140. Herein, the first-type semiconductor layer 130, the light-emitting layer 140, and the second-type semiconductor layer 150 can be defined as an epitaxial structure.

The patterned substrate 100a depicted in FIG. 1B is applied in the semiconductor structure 10a provided in the present embodiment, wherein the patterns 120a and the substrate 110a are integrally formed, and the first zone 112a and the second zone 114a of the substrate 110a are disposed in a concentric manner. Specifically, the sizes of the first patterns 122a disposed in the first zone 112a of the substrate 110a are different from the sizes of the second patterns 124a located in the second zone 114a. Thereby, the issue of the warpage of the edge of the conventional substrate in the heating process can be effectively prevented. In other words, the epitaxial structure to which the patterned epitaxial substrate 100a depicted in FIG. 1B can have an improved manufacturing yield, so that the semiconductor structure 10a can have good photoelectric properties and reliability. Note that the semiconductor structure 10a provided in the present embodiment is, for instance, applied to a micro LED of which the height is less than or equal to 6 μm and the width is less than or equal to 100 μm. Since the sizes of the patterns 120a in the nano-scale patterned epitaxial substrate 100a are different, the semiconductor structure 10a can have better photoelectric properties and reliability, which should however not be construed as a limitation in the disclosure.

Figure 5B:
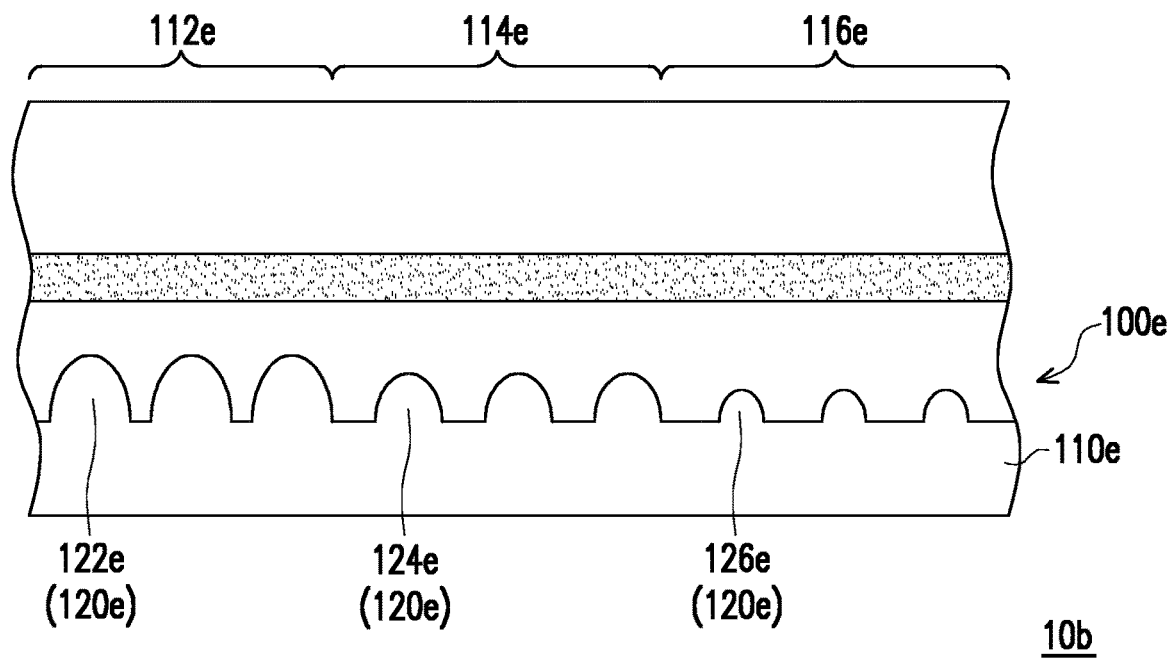
FIG. 5B is a schematic cross-sectional view of a semiconductor structure according to another embodiment of the disclosure.

FIG. 5B is a schematic cross-sectional view of a semiconductor structure according to another embodiment of the disclosure. With reference to FIG. 5B, the semiconductor structure 10b provided in the present embodiment is similar to the aforesaid semiconductor structure 10a, while the difference therebetween lies in that: in the present embodiment the semiconductor structure 10b to which the patterned epitaxial substrate 100e depicted in FIG. 3B is applied further has a third zone 116e surrounding the second zone 114e, and the third zone 116e, the first zone 112e, and the second zone 114e are disposed in a concentric manner. The patterns 120e further include a plurality of third patterns 126e, wherein the third patterns 126e are disposed in the third zone 116e of the substrate 110e. Specifically, sizes of the third patterns 126e are different from the sizes of the second patterns 124e and the sizes of the first patterns 122e.

Figure 6A:
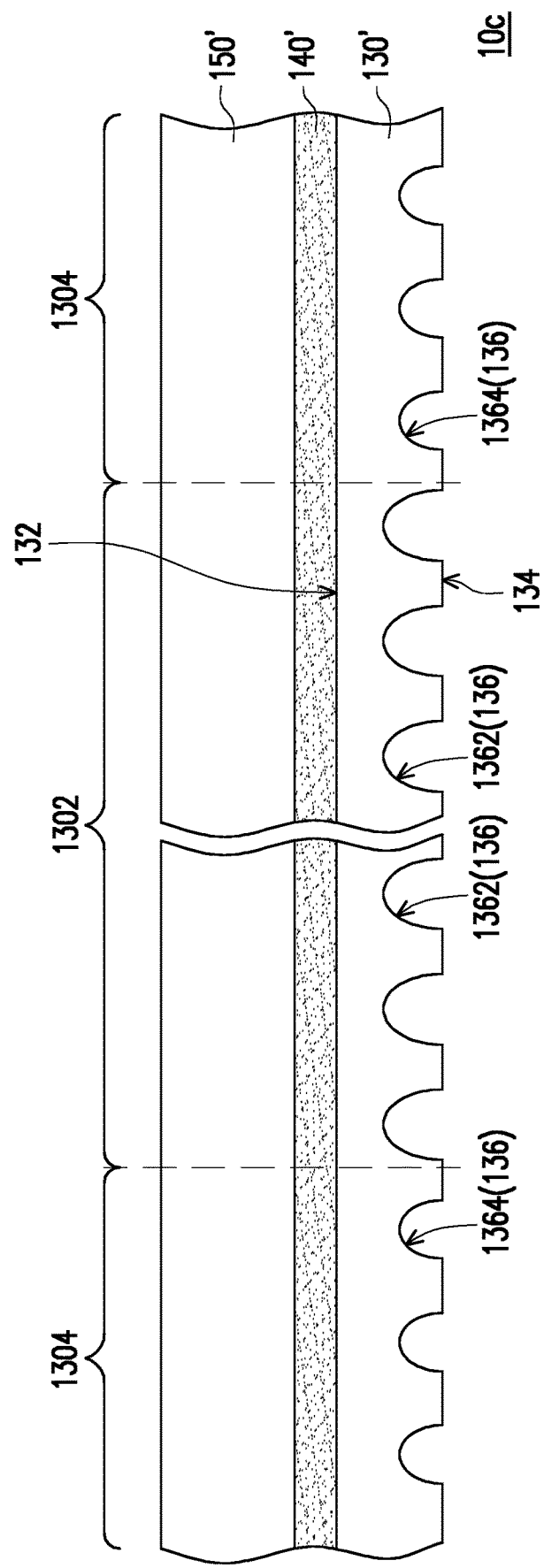
FIG. 6A is a schematic cross-sectional view of a semiconductor structure according to still another embodiment of the disclosure.

FIG. 6A is a schematic cross-sectional view of a semiconductor structure according to still another embodiment of the disclosure. With reference to FIG. 6A, the semiconductor structure 10c provided in the present embodiment includes a first-type semiconductor layer 130', a plurality of patterns 136, a light-emitting layer 140', and a second-type semiconductor layer 150'. The first-type semiconductor layer 130' has a top surface 132 and a bottom surface 134 opposite to each other, wherein the bottom surface 134 has a first zone 1302 and a second zone 1304 surrounding the first zone 1302, and the first zone 1302 and the second zone 1304 are disposed in a concentric manner. The patterns 136 and the first-type semiconductor layer 130' are integrally formed and arranged in an array on the bottom surface 134 of the first-type semiconductor layer 130'. Herein, the patterns 136 provided in the embodiment are concave patterns; however, in other embodiments that are not shown in the drawings, the patterns can also be convex patterns or other appropriate patterns, which should however not be construed as a limitation in the disclosure. Particularly, the patterns 136 provided in the embodiment includes first patterns 1362 and second patterns 1364. The first patterns 1362 are disposed in the first zone 1302, and the second patterns 1364 are disposed in the second zone 1304. The sizes of the first patterns 1362 are different from the sizes of the second patterns 1364. The light-emitting layer 140' is disposed on the top surface 132 of the first-type semiconductor layer 130', and the second-type semiconductor layer 150' is disposed on the light-emitting layer 140'.

In the semiconductor structure 10c provided in the present embodiment, the patterns 136 and the first-type semiconductor layer 130' are integrally formed, and the first zone 1302 and the second zone 1304 on the bottom surface 134 of the first-type semiconductor layer 130' are arranged in a concentric manner. Particularly, the sizes of the first patterns 1362 located in the first zone 1302 are different from the sizes of the second patterns 1364 in the second zone 1304. Thereby, the full band wavelength uniformity of the light-emitting layer 140' can be adjusted, so that the semiconductor structure 10c can have better light-emitting efficiency.

Figure 6B:
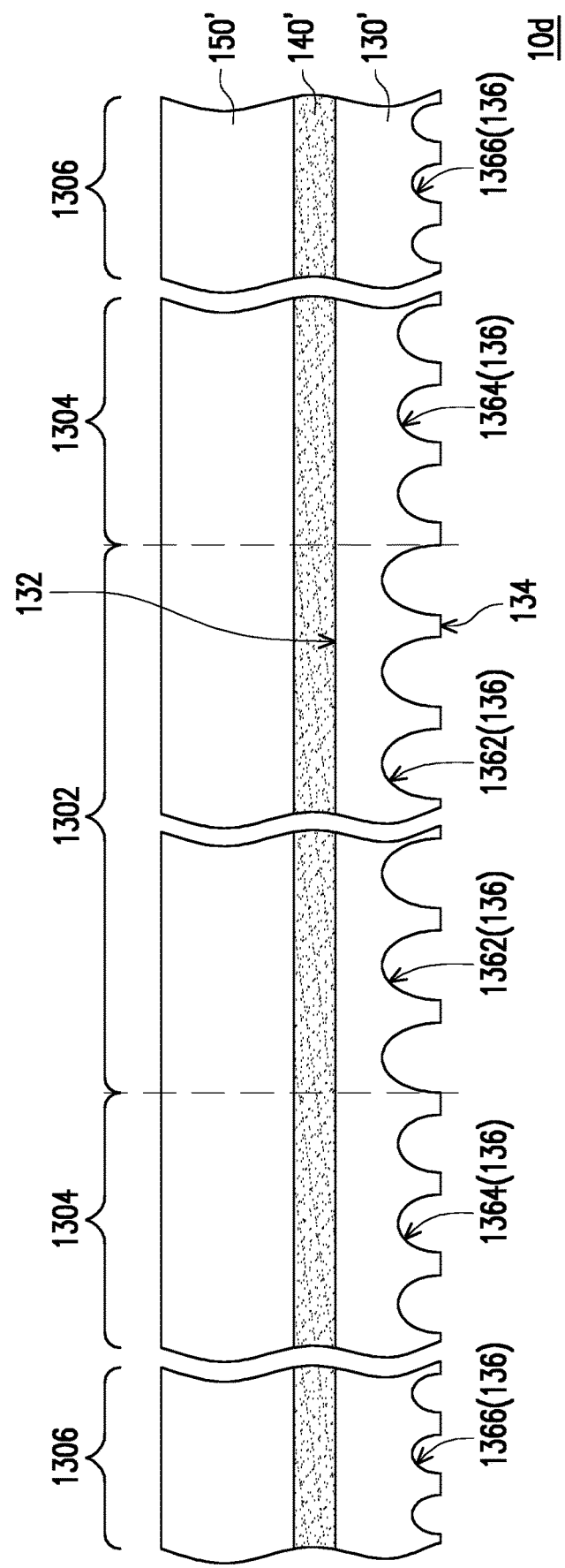
FIG. 6B is a schematic cross-sectional view of a semiconductor structure according to still another embodiment of the disclosure.

FIG. 6B is a schematic cross-sectional view of a semiconductor structure according to still another embodiment of the disclosure. With reference to FIG. 6B, the semiconductor structure 10d provided in the present embodiment is similar to the aforesaid semiconductor structure 10c, while the difference therebetween lies in that the semiconductor structure 10d provided in the present embodiment further has a third zone 1306 surrounding the second zone 1304, and the third zone 1306, the first zone 1302, and the second zone 1304 are disposed in a concentric manner. The patterns 136 further include a plurality of third patterns 1366 disposed in the third zone 1306 of the first-type semiconductor layer 130'. Specifically, the sizes of the third patterns 1366 are different from the sizes of the second patterns 1364 and the sizes of the first patterns 1362.

Figure 7A:
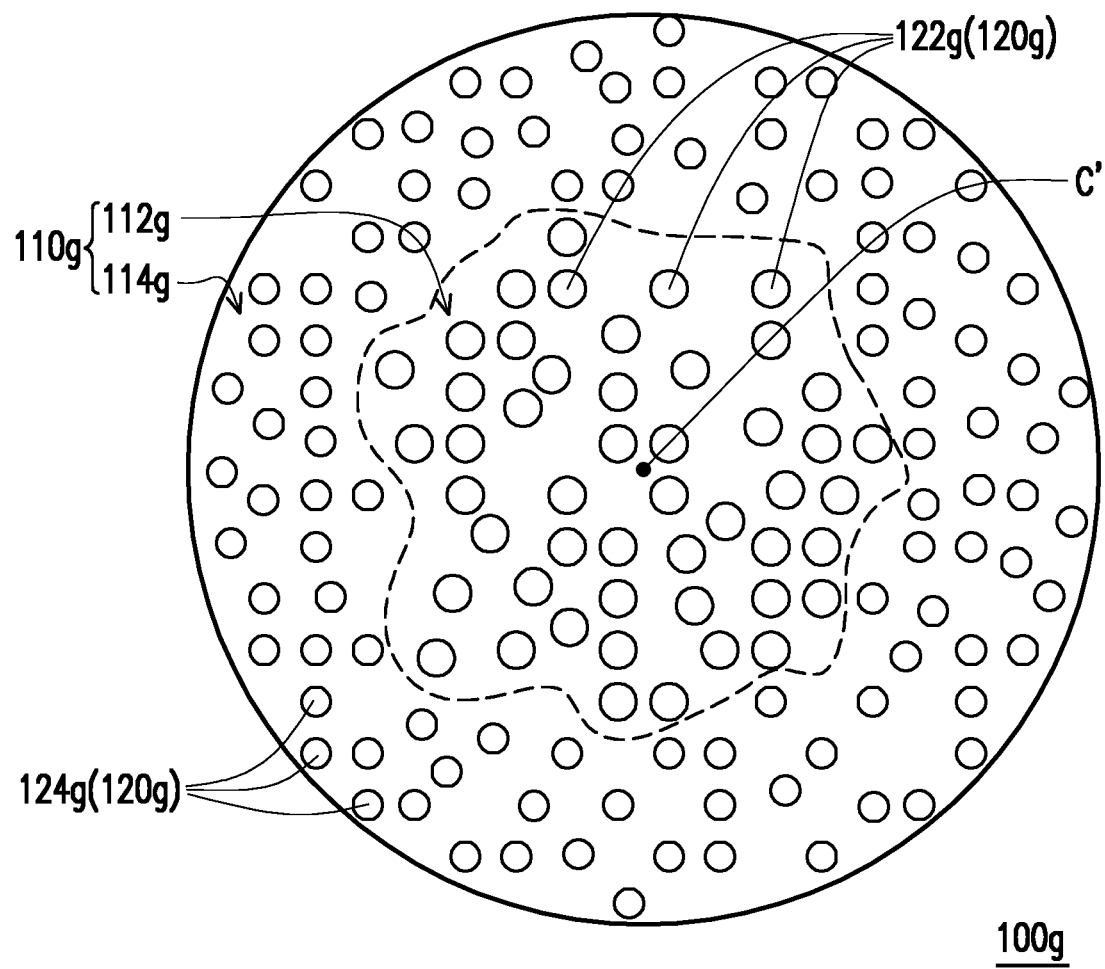
FIG. 7A is a schematic top view of a patterned epitaxial substrate according to an embodiment of the disclosure.

FIG. 7A is a schematic top view of a patterned epitaxial substrate according to an embodiment of the disclosure. With reference to FIG. 1A and FIG. 7A, the substrate 110g provided in the embodiment is similar to the aforesaid substrate 110a, while the difference therebetween lies in that the first patterns 122a of the first zone 112a are disposed around a center C of the substrate 110a with the same pitch, and the first patterns 122g of the first zone 112g are random surround with different pitches. In more detail, the substrate 110g has the first zone 112g and the second zone 114g surrounding the first zone 112g. The patterns 120g include a plurality of first patterns 122g and a plurality of second patterns 124g. The first zone 112g is a randomly surrounded area, but surrounds the center C' of the substrate 110g. This means the first zone 112g has no specific shape and the first patterns 122g of the first zone 112g are randomly arranged to more disperse the stress during epitaxy. The second patterns 124g of the second zone 114g are also randomly arranged, and the sizes of the first patterns 122g located in the first zone 112g of the substrate 110g are greater than the sizes of the second patterns 124g located in the second zone 114g. In other words, the first zone can be surround completely (as shown in the first zone 112a of FIG. 1A) or randomly (as shown in the first zone 112g of FIG. 7A). Herein, a ratio of the first zone 112g to the substrate 110g is from 0.4 to 0.8, and a ratio of the second zone 114g to the substrate 110g is 0.1 to 0.5, so as to better solve the problem of warpage of the edge.

Figure 7B:
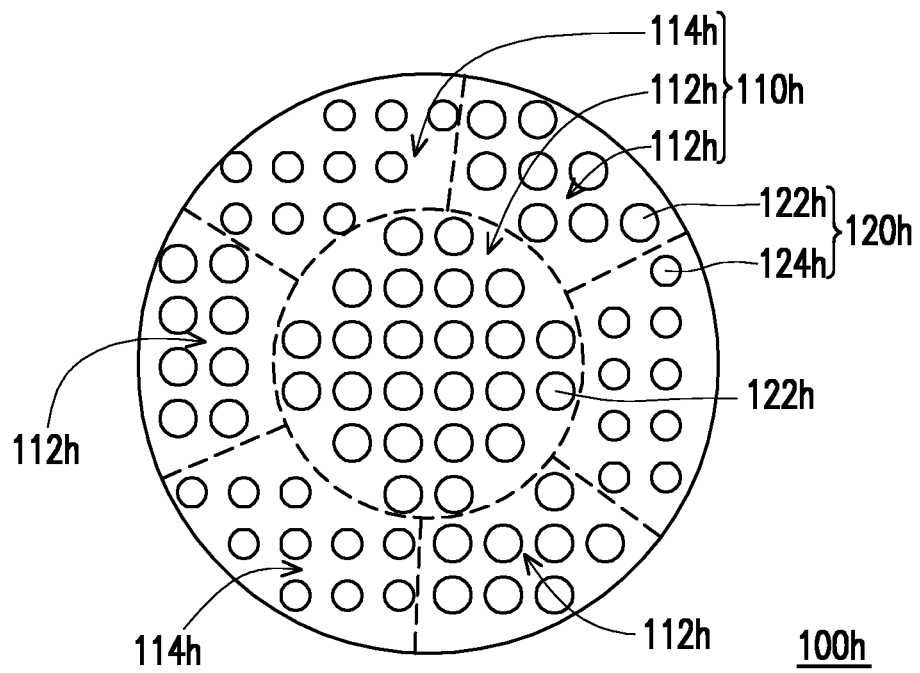
FIG. 7B is a schematic top view of a patterned epitaxial substrate according to another embodiment of the disclosure.

FIG. 7B is a schematic top view of a patterned epitaxial substrate according to another embodiment of the disclosure. With reference to FIG. 1A and FIG. 7B, the substrate 110h provided in the embodiment is similar to the aforesaid substrate 110a, while the difference therebetween lies in that the second zone 114h of the substrate 110h is randomly distributed outside the first zone 112h. In more detail, the substrate 110h has the first zone 112h and the second zone 114h surrounding the first zone 112h. Herein, a part of the first zone 112h and the second zone 114h form a circle to surround another part of the first zone 112h. In other words, the part of the first zone 112h and the second zone 114h are alternately arranged outside the another part of the first zones 112h. The shapes of the part of the first zone 112h and the second zone 114h are both fan-like, and the shape of the another part of the first zone 112h is circular. In addition, the patterns 120h include a plurality of first patterns 122h and a plurality of second patterns 124h. The sizes of the first patterns 122h located in the first zone 112h of the substrate 110h are greater than the sizes of the second patterns 124h located in the second zone 114h.

Figure 7C:
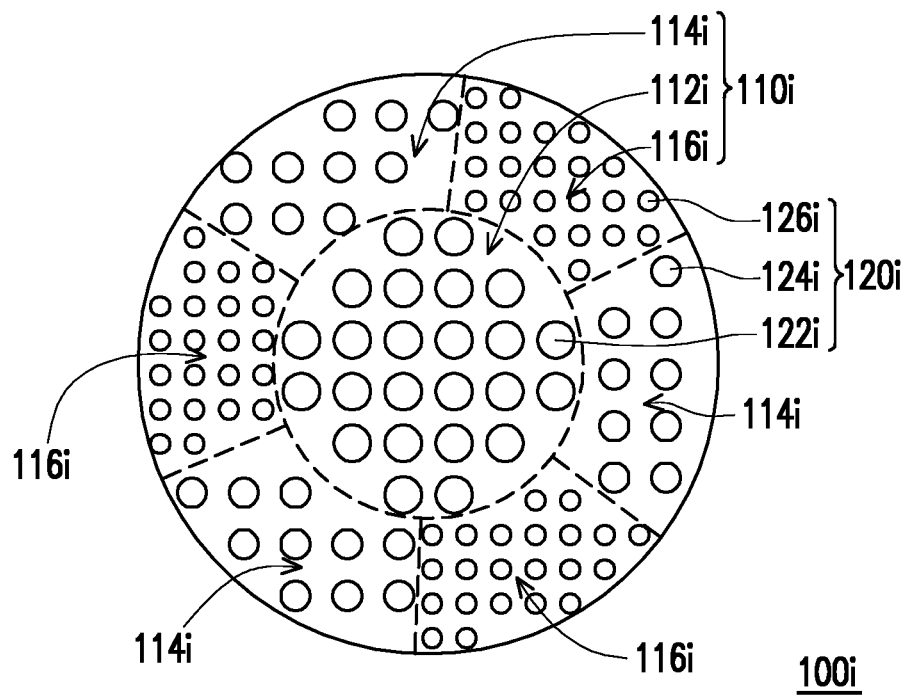
FIG. 7C is a schematic top view of a patterned epitaxial substrate according to another embodiment of the disclosure.

FIG. 7C is a schematic top view of a patterned epitaxial substrate according to another embodiment of the disclosure. With reference to FIG. 7A and FIG. 7C, the substrate 110i provided in the embodiment is similar to the aforesaid substrate 110g, while the difference therebetween lies in that the substrate 110i further has a third zone 116i, and the third zone 116i and the second zone 114i form a circle to surround the first zone 112i. The second zone 114i and the third zone 116i are alternately arranged outside the first zones 112i. In other words, the shapes of the second zone 114i and the third zone 116i are both fan-like, and the shape of the first zone 112i is circular. Herein, a ratio of the first zone 112i to the substrate 110i is from 0.4 to 0.8, and a ratio of the second zone 114i to the substrate 110i is 0.1 to 0.5, so as to better solve the problem of warpage of the edge. In addition, the patterns 120i include a plurality of first patterns 122i, a plurality of second patterns 124i and a plurality of third patterns 126i. The sizes of the first patterns 122i located in the first zone 112i of the substrate 110i are greater than the sizes of the second patterns 124i located in the second zone 114i and the sizes of the third patterns 126i located in the third zone 116i.

Figure 8A:
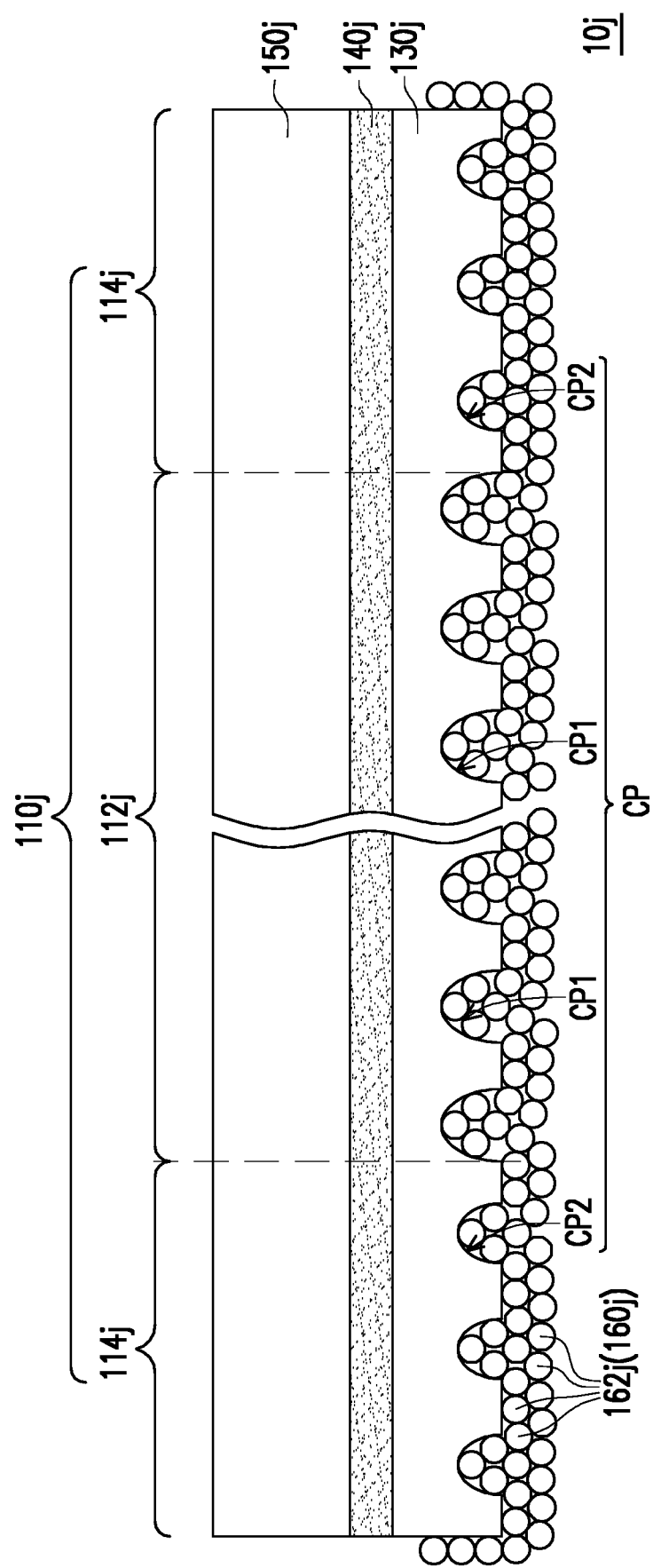
FIG. 8A is a schematic cross-sectional view of a semiconductor structure according to still another embodiment of the disclosure.

FIG. 8A is a schematic cross-sectional view of a semiconductor structure according to still another embodiment of the disclosure. With reference to FIG. 6A and FIG. 8A, the semiconductor structure 10j provided in the present embodiment is similar to the aforesaid semiconductor structure 10c, while the difference therebetween lies in that the semiconductor structure 10j further includes a wavelength converting layer 160j with a particle size of less than 100 nanometers, and the wavelength converting layer 160j is disposed in the patterns CP. The wavelength converting layer 160j includes a plurality of quantum dots 162j, and the particle size of the quantum dots 162j is less than 100 nanometers, preferably, is less than 30 nanometers, which can have better conversion rate.

In more detail, the semiconductor structure 10j provided in the present embodiment includes a first-type semiconductor layer 130j, a plurality of patterns CP, a light-emitting layer 140j, and a second-type semiconductor layer 150j. The patterns CP provided in the embodiment includes first patterns CP1 and second patterns CP2. The first patterns CP1 are disposed in the first zone 112j of the substrate 110j, and the second patterns CP2 are disposed in the second zone 114j of the substrate 110j. The sizes of the first patterns CP1 are different from the sizes of the second patterns CP2. The wavelength converting layer 160j cover the first patterns CP1, the second patterns CP2 and part of the sidewall of the first-type semiconductor layer 130j. Herein, a volume ratio of the patterns CP to the wavelength converting layer 160j is greater than or equal to 0.5 and less than or equal to 1.0. In other words, there is a certain ratio between the volume of the grooves formed by the patterns CP and the filling volume formed by the wavelength converting layer 160j. By adopting periodic patterned grooves (i.e. formed by the patterns CP) on the surface of the semiconductor structure 10j, the wavelength converting layer 160j can be easily filled in the patterns CP, thereby increasing the distribution density of quantum dots 162j. The wavelength converting layer of the prior art is all configured only on the surface of the epitaxial structure which easily causes poor coverage of the surfaces or sidewalls. The present embodiment, the quantum dots 162j are filled in the patterns CP which can effectively increase the absorption of blue light by the quantum dots 162j, so as to improve the overall color conversion efficiency of the quantum dots 162j.

Figure 8B:
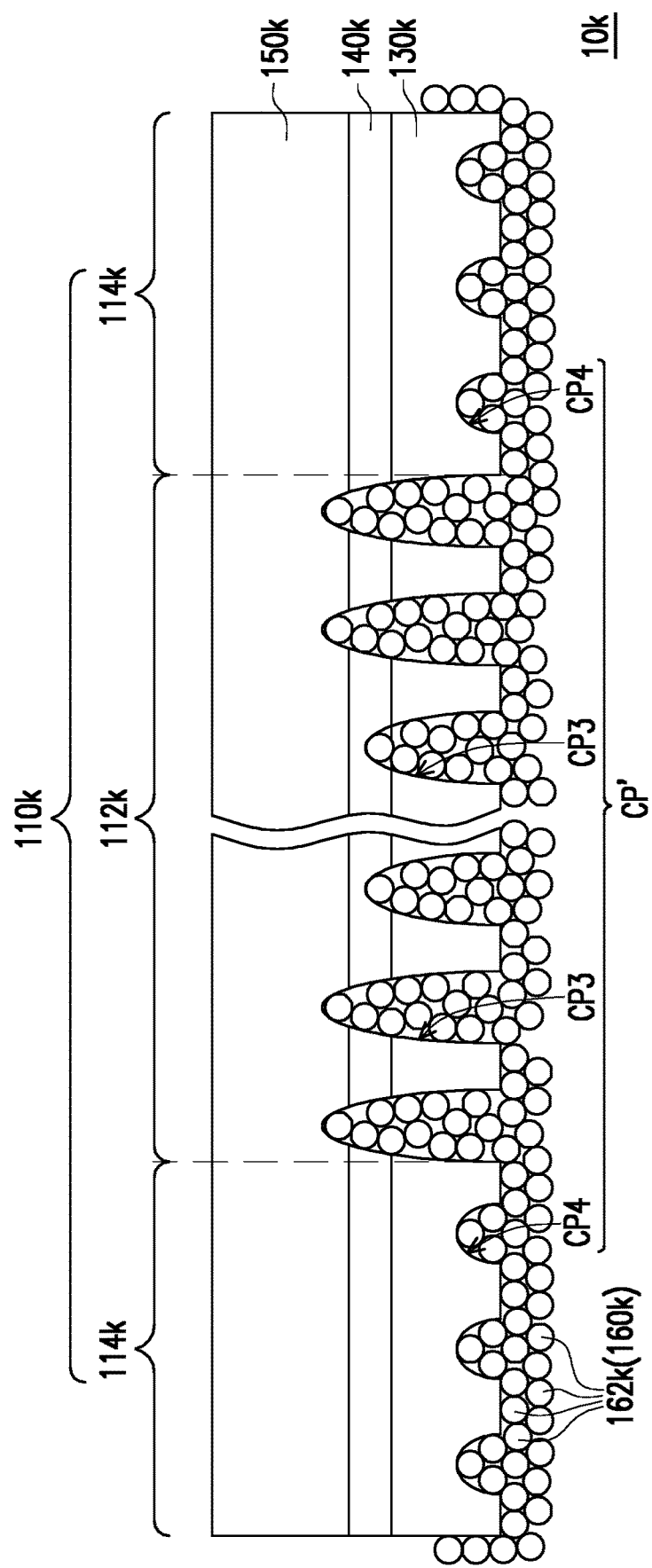
FIG. 8B is a schematic cross-sectional view of a semiconductor structure according to still another embodiment of the disclosure.

FIG. 8B is a schematic cross-sectional view of a semiconductor structure according to still another embodiment of the disclosure. With reference to FIG. 8A and FIG. 8B, the semiconductor structure 10k provided in the present embodiment is similar to the aforesaid semiconductor structure 10j, while the difference therebetween lies in that the patterns CP' partially or completely pass through an area of the light-emitting layer 140k. In more detail, the patterns CP' provided in the embodiment includes first patterns CP3 and second patterns CP4, and the sizes of the first patterns CP3 disposed in the first zone 112k of the substrate 110k are different from the sizes of the second patterns CP4 disposed in the second zone 114k of the substrate 110k. A port of the first patterns CP3 partially pass through the first-type semiconductor layer 130k and extend into the area of the light-emitting layer 140k. Another port of the first patterns CP3 completely pass through the first-type semiconductor layer 130k and the area of the light-emitting layer 140k, and extend into the second-type semiconductor layer 150k. Therefore, when the wavelength converting layer 160k is filled into the patterns C, the quantum dots 162k can be closer to the light-emitting layer 140k. In addition, the depth of the patterns CP can also be increased by etching to reduce the distance between the quantum dots 162k and the light-emitting layer 140k, thereby improving the color conversion efficiency. In particular, a minimum distance between the patterns CP passing through the area of the light-emitting layer is greater than or equal to 1 nanometer. If the minimum distance less than 1 nanometer, it is easy to cause defects in the light-emitting layer. In particular, a minimum distance between the patterns CP passing through the area of the light-emitting layer is between 1 nanometer to 100 nanometer to achieve a better color conversion efficiency. A ratio of an etching depth of the patterns to a height of the semiconductor structure is less than or equal to 0.8, preferably less than 0.5, to avoid chip damage and poor yield.

To sum up, according to the design of the patterned epitaxial substrate provided in one or more embodiments of the disclosure, the patterns and the substrate are integrally formed, different zones of the substrate are disposed in a concentric manner, and the sizes of the patterns disposed in different zones are different. Thereby, the issue of the warpage of the edge of the conventional substrate in the heating process can be effectively prevented, and the yield of the subsequent manufacturing processes can be improved. In an embodiment of the disclosure, the sizes (e.g., the orthogonal projection area, the vertical height, or the pitch) of the patterns in different zones can appear to have a progressive change (gradually increased or decreased) in a radial direction from the center to the edge of the substrate, so as to prevent warpage of the edge. Besides, the semiconductor structure to which the aforesaid patterned epitaxial substrate is applied can have good photoelectric properties and reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A patterned epitaxial substrate comprising:
   a substrate having a first zone and a second zone surrounding the first zone, wherein the first zone is disposed around a center of the substrate; and
   a plurality of patterns disposed on the substrate, the plurality of patterns and the substrate being integrally formed, the plurality of patterns comprising:
      a plurality of first patterns disposed in the first zone; and
      a plurality of second patterns disposed in the second zone, wherein sizes of the plurality of first patterns are different from sizes of the plurality of second patterns.

2. The patterned epitaxial substrate according to claim 1, wherein each of the plurality of first patterns has a first orthogonal projection area on the substrate, each of the plurality of second patterns has a second orthogonal projection area on the substrate, and the first orthogonal projection area is greater than the second orthogonal projection area,
   wherein each of the plurality of first patterns has a first vertical height on the substrate, each of the plurality of second patterns has a second vertical height on the substrate, each of the plurality of first patterns has a first bottom width on the substrate, each of the plurality of second patterns has a second bottom width on the substrate, the first vertical height is greater than the second vertical height, and the first bottom width is greater than the second bottom width.

3. The patterned epitaxial substrate according to claim 1, wherein there is a first pitch between any two adjacent first patterns of the plurality of first patterns, there is a second pitch between any two adjacent second patterns of the plurality of second patterns, and the first pitch is less than the second pitch.

4. The patterned epitaxial substrate according to claim 1, wherein a ratio of the first zone to the substrate is from 0.4 to 0.8, and a ratio of the second zone to the substrate is 0.1 to 0.5.

5. The patterned epitaxial substrate according to claim 1, wherein the substrate further has a third zone surrounding the second zone, the plurality of patterns further comprise a plurality of third patterns disposed in the third zone, and sizes of the plurality of third patterns are different from the sizes of the plurality of second patterns and the sizes of the plurality of first patterns;
   wherein a ratio of the first zone to the substrate is 0.4 to 0.8, and a ratio of the second zone to the substrate is 0.1 to 0.5.

6. A semiconductor structure comprising:
   a patterned epitaxial substrate comprising:
      a substrate having a first zone and a second zone surrounding the first zone, wherein the first zone is disposed around a center of the substrate; and
      a plurality of patterns disposed on the substrate, the plurality of patterns and the substrate being integrally formed, the plurality of patterns comprising:
         a plurality of first patterns disposed in the first zone; and
         a plurality of second patterns disposed in the second zone, wherein sizes of the plurality of first patterns are different from sizes of the plurality of second patterns;
   a first-type semiconductor layer disposed on the patterned epitaxial substrate;
   a light-emitting layer disposed on the first-type semiconductor layer; and
   a second-type semiconductor layer disposed on the light-emitting layer.

7. A semiconductor structure comprising:
   a first-type semiconductor layer having a top surface and a bottom surface opposite to each other, the bottom surface having a first zone and a second zone surrounding the first zone, wherein the first zone is disposed around a center of the bottom surface;
   a plurality of patterns disposed on the bottom surface of the first-type semiconductor layer, the plurality of patterns and the first-type semiconductor layer being integrally formed, the plurality of patterns comprising:
      a plurality of first patterns disposed in the first zone; and
      a plurality of second patterns disposed in the second zone, wherein sizes of the plurality of first patterns are different from sizes of the plurality of second patterns;
   a light-emitting layer disposed on the top surface of the first-type semiconductor layer; and
   a second-type semiconductor layer disposed on the light-emitting layer.

8. The semiconductor structure according to claim 7, further comprising:
   a wavelength converting layer with a particle size of less than 100 nanometers, disposed in the plurality of patterns.

9. The semiconductor structure according to claim 8, wherein a volume ratio of the plurality of patterns to the wavelength converting layer is greater than or equal to 0.5 and less than or equal to 1.0.

10. The semiconductor structure according to claim 7, wherein the plurality of patterns partially or completely pass through an area of the light-emitting layer.

11. The semiconductor structure according to claim 10, wherein a minimum distance between the patterns passing through the area of the light-emitting layer is greater than or equal to 1 nanometer.

12. The semiconductor structure according to claim 10, wherein a ratio of an etching depth of the plurality of patterns to a height of the semiconductor structure is less than or equal to 0.8.

13. The semiconductor structure according to claim 7, wherein the first patterns of the first zone are random surround with different pitches.

* * * * *